(12) United States Patent
de Larios et al.

(10) Patent No.: US 6,616,772 B2
(45) Date of Patent: Sep. 9, 2003

(54) METHODS FOR WAFER PROXIMITY CLEANING AND DRYING

(75) Inventors: John Martin de Larios, Palo Alto, CA (US); Mike Ravkin, Sunnyvale, CA (US); Glen Travis, Sunnyvale, CA (US); Jim Keller, Livermore, CA (US); Wilbur Krusell, Incline Village, NV (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/309,641

(22) Filed: Dec. 3, 2002

(65) Prior Publication Data

US 2003/0075204 A1 Apr. 24, 2003

Related U.S. Application Data

(62) Division of application No. 09/608,244, filed on Jun. 30, 2000, now Pat. No. 6,488,040.

(51) Int. Cl.[7] ................................................. B08B 3/00
(52) U.S. Cl. ............................. 134/21; 134/26; 134/30; 134/36; 134/902
(58) Field of Search .............................. 134/1, 1.3, 21, 134/26, 30, 36, 37, 902

(56) References Cited

U.S. PATENT DOCUMENTS

| 5,472,502 A | * | 12/1995 | Batchelder ..................... 118/52 |
| 5,709,757 A | * | 1/1998 | Hatano et al. ........... 134/22.14 |
| 6,086,454 A | * | 7/2000 | Watanabe et al. .............. 451/36 |
| 6,092,937 A | * | 7/2000 | Snodgrass et al. .......... 396/611 |

* cited by examiner

*Primary Examiner*—Randy Gulakowski
*Assistant Examiner*—Joseph Perrin
(74) *Attorney, Agent, or Firm*—Martine & Penilla, LLP

(57) ABSTRACT

A method for preparing a semiconductor wafer surface is provided which includes providing a plurality of source inlets and a plurality of source outlets and applying isopropyl alcohol (IPA) vapor gas through the plurality of source inlets to the wafer surface when the plurality of source inlets and outlets are in close proximity to the wafer surface. The method also includes applying a fluid through the plurality of source inlets to the wafer surface while applying the IPA vapor gas, and removing the applied IPA vapor gas and fluid from the wafer surface through the plurality of source outlets.

16 Claims, 10 Drawing Sheets

$[P_1 > P_2]$

METHODS FOR WAFER PROXIMITY CLEANING AND DRYING

CROSS REFERENCE TO RELATED APPLICATION

This is a divisional application of copending prior U.S. patent application Ser. No. 09/608,244 entitled "CAPILLARY PROXIMITY HEADS FOR SINGLE WAFER CLEANING AND DRYING" filed on Jun. 30, 2000, now U.S. Pat. No. 6,488,040, the disclosure of which is hereby incorporated by reference, and from which priority under 35 U.S.C. §120 is claimed.

BACKGROUND OF THE INVENTION

1. Field of the Invention

The present invention relates to semiconductor wafer cleaning and drying and, more particularly, to apparatuses and techniques for more efficiently removing fluids from wafer surfaces of interest while reducing contamination and decreasing wafer cleaning cost.

2. Description of the Related Art

In the semiconductor chip fabrication process, it is well-known that there is a need to clean and dry a wafer where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin drying, IPA drying, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface.

The most prevalent drying technique used today is spin rinse drying (SRD). FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (ie., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Therefore, there is a need for a method and an apparatus that avoids the prior art by allowing quick and efficient cleaning and drying of a semiconductor wafer, but at the same time reducing the formation of water or cleaning fluid droplets which may cause contamination to deposit on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a cleaning and drying apparatus and method that removes fluids from wafer surfaces quickly while at the same time reducing droplet formation that can cause wafer contamination. It should be appreciated that the present invention can be implemented in numerous ways, including as a process, an apparatus, a system, a device or a method. Several inventive embodiments of the present invention are described below.

In one embodiment, a method for preparing a semiconductor wafer surface is provided which includes providing a plurality of source inlets and a plurality of source outlets and applying isopropyl alcohol (IPA) vapor gas through the plurality of source inlets to the wafer surface when the plurality of source inlets and outlets are in close proximity to the wafer surface. The method also includes applying a fluid through the plurality of source inlets to the wafer surface while applying the IPA vapor gas, and removing the applied IPA vapor gas and fluid from the wafer surface through the plurality of source outlets.

In another embodiment, a method for cleaning and drying a semiconductor wafer is provided which includes providing a proximity head which includes a plurality of source inlets and a plurality of source outlets and providing the proximity head close to a wafer surface. The method further includes generating a first pressure on a fluid film present on the wafer surface when the proximity head is in a first position that is close to the wafer surface and introducing a second pressure on the fluid film present on the wafer surface when the proximity head is in the first position. The method also includes producing a pressure difference wherein the first pressure is greater than the second pressure, the pressure difference being configured to cause the removal of the fluid film from the wafer surface.

The advantages of the present invention are numerous. Most notably, by creating apparatuses and methods to efficiently dry and clean a semiconductor wafer while reducing formation of droplets, wafer processing and production may be increased and higher wafer yields may be achieved due to the lower levels of contamination of the wafers. The present invention allows the improved drying and cleaning because of the use of a combination of capillary action (such as, for example, capillary attraction), suction, and gas or liquid input. The pressures generated on fluid at the wafer surface by the aforementioned forces allow optimal removal of fluid at the wafer surface with a significant reduction in droplet formation as compared with other cleaning and drying techniques. The present invention reduces the breakdown of liquid/gas interfaces and especially works well when used to process hydrophobic wafers. Therefore, the present invention evacuates fluid from wafer surfaces with extreme effectiveness while substantially reducing contaminant formation due to droplet formation.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for methods and apparatuses for cleaning and drying a wafer is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1:
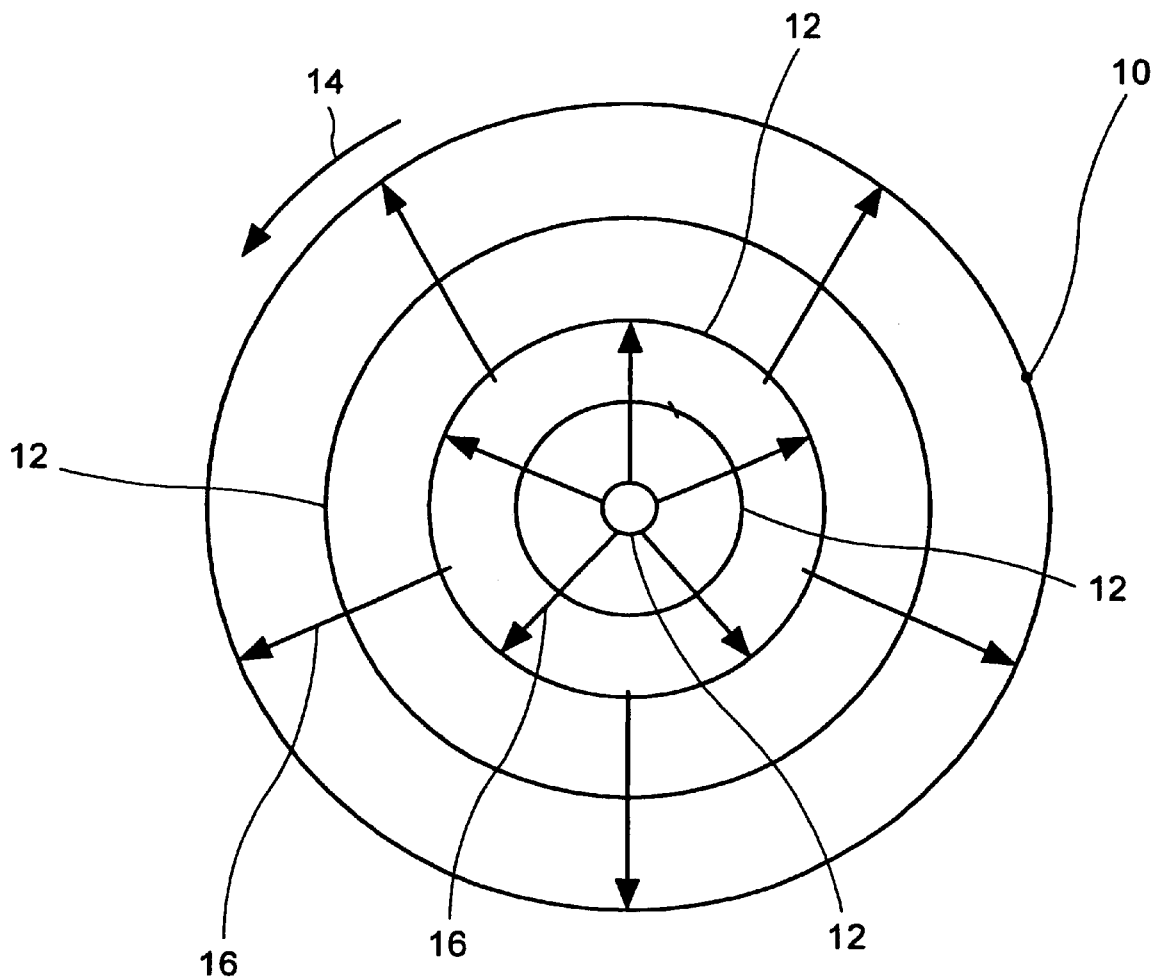
FIG. 1 illustrates movement of cleaning fluids on a wafer during an SRD drying process.
Figure 2A:
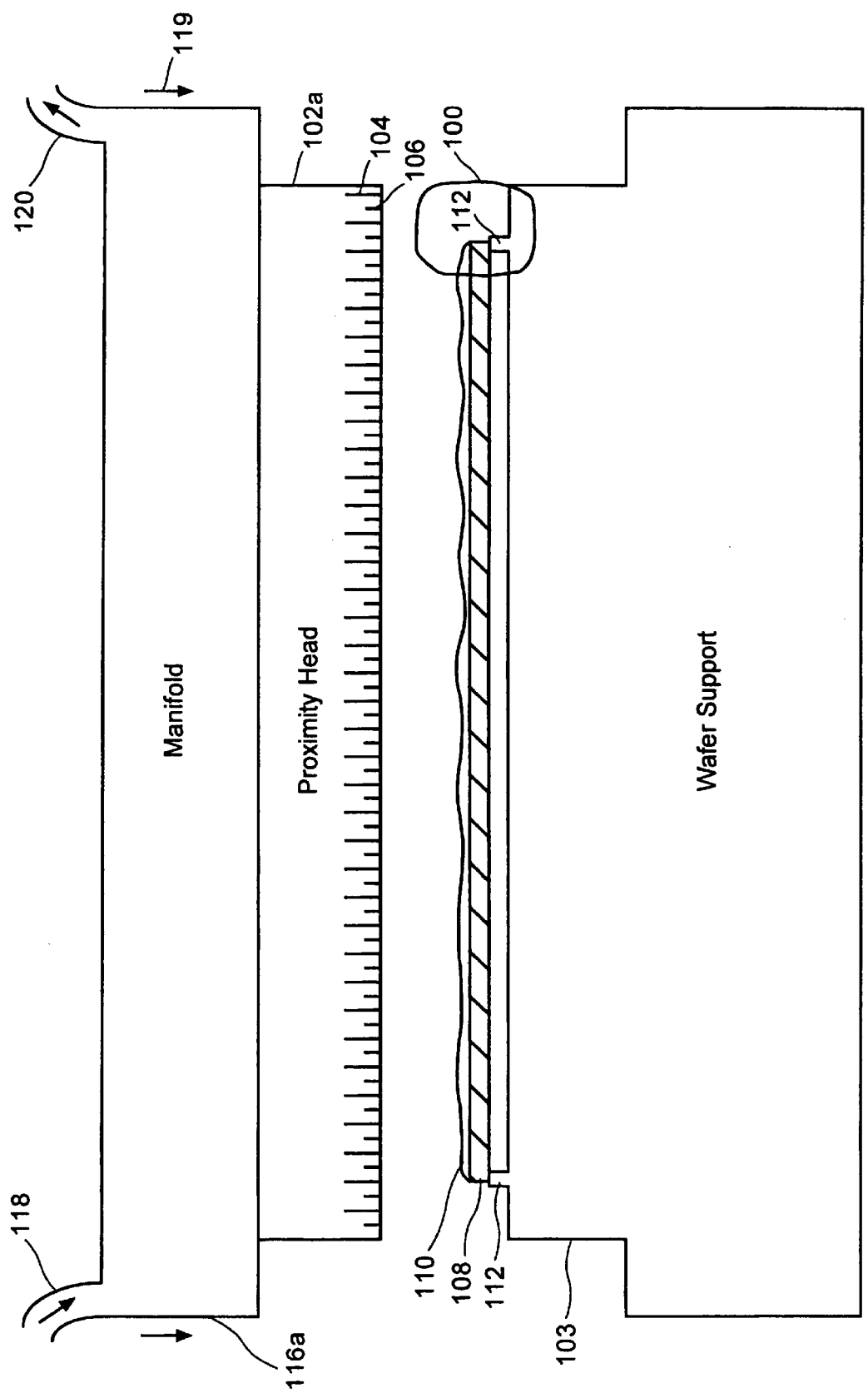
FIG. 2A shows a high level view of a wafer cleaning and drying apparatus in accordance with one embodiment of the present invention.

FIG. 2A shows a high level view of a wafer cleaning and drying apparatus in accordance with one embodiment of the present invention. In this embodiment, a manifold 116a is attached to a proximity head 102a. The manifold 116a is also connected to inlets 118 and outlets 120. The proximity head 102a includes a plurality of source inlets 106 and a plurality of source outlets 104. In a drying process, the proximity head 102a is located over a wafer 108 which has a fluid film 110 on a wafer surface. In one embodiment, the proximity head 102a may be utilized to clean the wafer 108 in which case the wafer 108 may or may not have a fluid film 110 when the proximity head 102a is lowered. The wafer 108 is held up by a wafer support 103 by use of support pins 112. Magnification 100 shows a close-up view of the support pins 112.

To initiate cleaning and/or drying operations, the manifold 116a and the proximity head 102a moves into a position in close proximity to the wafer 108 by movement 119. The proximity head 102a dries or cleans the wafer 108 by introducing a first pressure toward the wafer surface by the use of a gas or a liquid (gas when drying and liquid when cleaning) from the inlets 118 inputted through the plurality of source inlets 106. A second pressure away from the wafer surface is generated by capillary action (such as, for example, capillary attraction) and suction (from a partial vacuum created by the manifold 116a) from the plurality of source outlets 104. From the application of the first pressure and the second pressure where the first pressure is greater than the second pressure, the fluid film 110 is pulled off of the wafer 108 and into the plurality of source outlets 104. (This process is discussed in further detail in reference to FIGS. 6, 7, and 8.) Then the fluid film 110 is pulled away from the plurality of source outlets 104 into the manifold 116a. The extracted liquid is then taken away from the manifold 116a by the outlets 120. As discussed further below, this quick and efficient removal of the fluid film 110 results in a dry (or clean) wafer while significantly reducing the formation of droplets which can cause contamination to remain on the surface of the wafer 108.

Figure 2B:
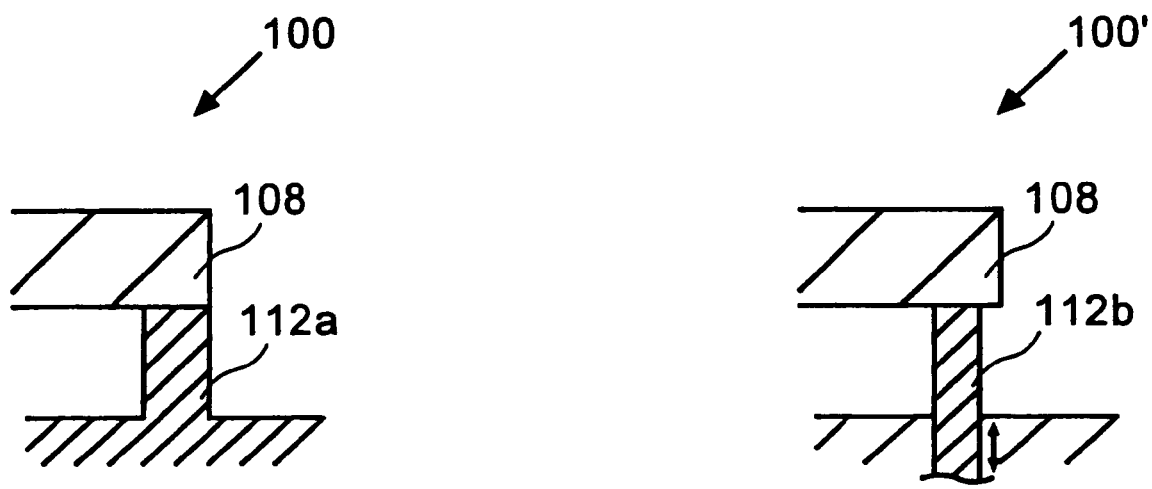
FIG. 2B shows two examples of support pins in accordance with one embodiment of the present invention.

FIG. 2B shows a magnification 100 and a magnification 100' of support pins 112 in accordance with one embodiment of the present invention. In magnification 100, the wafer 108 is supported by support pins 112a. In one embodiment, the support pins 112a are fixed and immovable. A cleaning and drying apparatus using the support pins 112a only cleans or dries a top surface of the wafer 108 because a bottom surface is inaccessible to the proximity head 102a.

In magnification 100', the wafer 108 is held up by support pins 112b. In this embodiment, the support pins 112b may move up and down. In this way, the wafer 108 resting on the support pins 112b may be lowered down to a position close to a bottom proximity head 102b to initiate cleaning or drying of a bottom surface of the wafer 108. As can be seen, the present invention is extremely flexible and can be used in a variety of different ways depending on the requirements of wafer manufacturing methods.

Figure 2C:
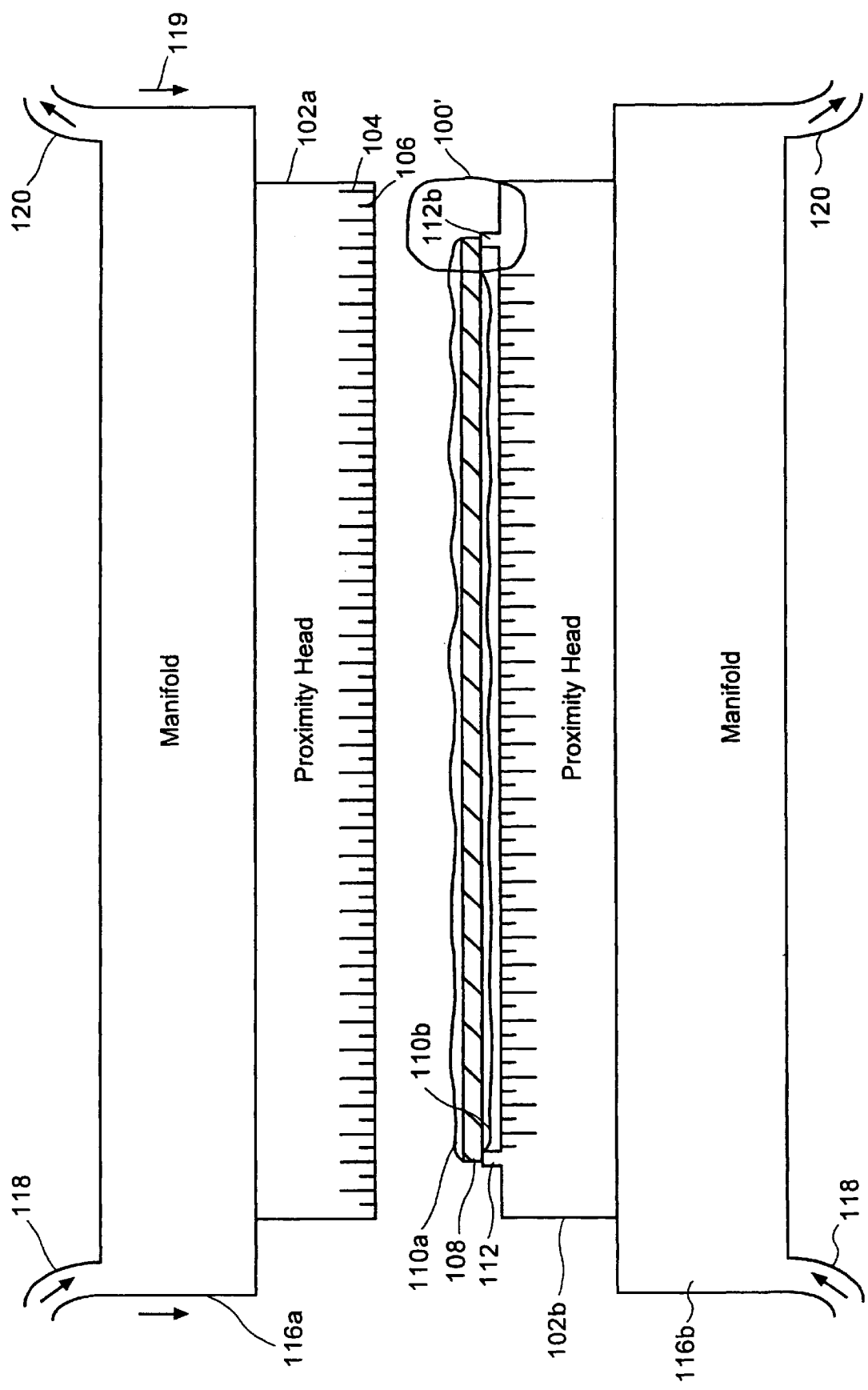
FIG. 2C shows a wafer cleaning and drying apparatus where both top and bottom surfaces of a wafer may be dried or cleaned in accordance with one embodiment of the present invention.

FIG. 2C shows a wafer cleaning and drying apparatus where both top and bottom surfaces of a wafer 108 may be dried or cleaned in accordance with one embodiment of the present invention. In this embodiment, a manifold 116a is attached to a proximity head 102a, and a manifold 116b is attached to a proximity head 102b. Both of the proximity heads 102 have a plurality of source inlets 106 and a plurality of source outlets 104. Both of the manifolds 116 also have inlets 118 and outlets 120. The proximity head 102b has support pins 112b, which as discussed in reference to FIG. 2B, may suspend the wafer 108 and, when drying or cleaning is desired, lower the wafer 108 to a position close to the proximity head 102b. The proximity head 102a may then be lowered to close proximity of the wafer 108 by movement 119 to initiate drying or cleaning of both the top and bottom surfaces of the wafer 108. During this process, the plurality of source inlets 106 of proximity heads 102 introduces pressurized gas or liquid from the inlets 118 onto the top and bottom surfaces of the wafer 108. At the same time, suction is created by generation of a partial vacuum by the manifolds 116, and capillary action is produced by each of the plurality of source outlets 104. As a result, the fluid film 110 on both of the wafer surfaces are evacuated into the plurality of the source outlets 104. Outflowing liquid is then removed from the proximity heads 102 through the manifolds 116 and out of the apparatus by way of the outlets 120. Therefore, the fluid film 110 on both sides of the wafer 108 are extracted and the wafer 108 is either cleaned or dried in an efficient and effective manner with an extremely reduced amount of remaining contamination as opposed to the presently available fluid removal methods.

Figure 3:
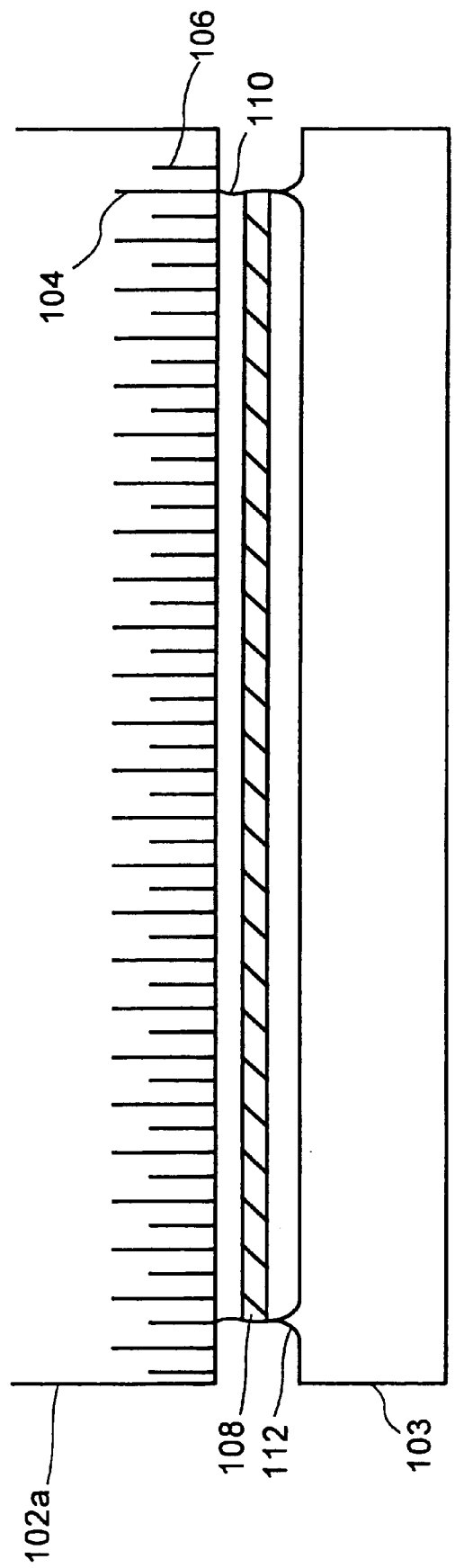
FIG. 3 depicts a wafer cleaning and drying apparatus where a top surface of a wafer is being dried in accordance with one embodiment of the present invention.

FIG. 3 depicts a wafer cleaning and drying apparatus where a top surface of a wafer 108 is being dried in accordance with one embodiment of the present invention. In this embodiment, the wafer 108 rests on support pins 112. In one embodiment, the proximity head 102a is configured to clean and dry a wafer 108 that is 300 mm in diameter. It should be appreciated that the cleaning and drying apparatus described may be configured to clean or dry a wafer of any size such as, for example, smaller or larger than 300 mm. The support pins 112 are attached to a wafer support 103. A proximity head 102a containing a plurality of source inlets 106 and a plurality of source outlets 104 is in contact with a fluid film 110 which is on a top surface of the wafer 108. In one embodiment, the proximity head may move to about in the wafer plane to initiate the capillary action. The proximity head 102a moves to a position where output from the plurality of source outlets 104 may move over the wafer 108 to the plurality of source inlets 106. The distance of the proximity head 102a to the wafer 108 during fluid removal operations may also depend on wafer surface properties. It should be appreciated that the proximity head may move to any distance from the surface of the wafer 108 as long as fluid may be removed from the wafer surface by capillary action.

Figure 4:
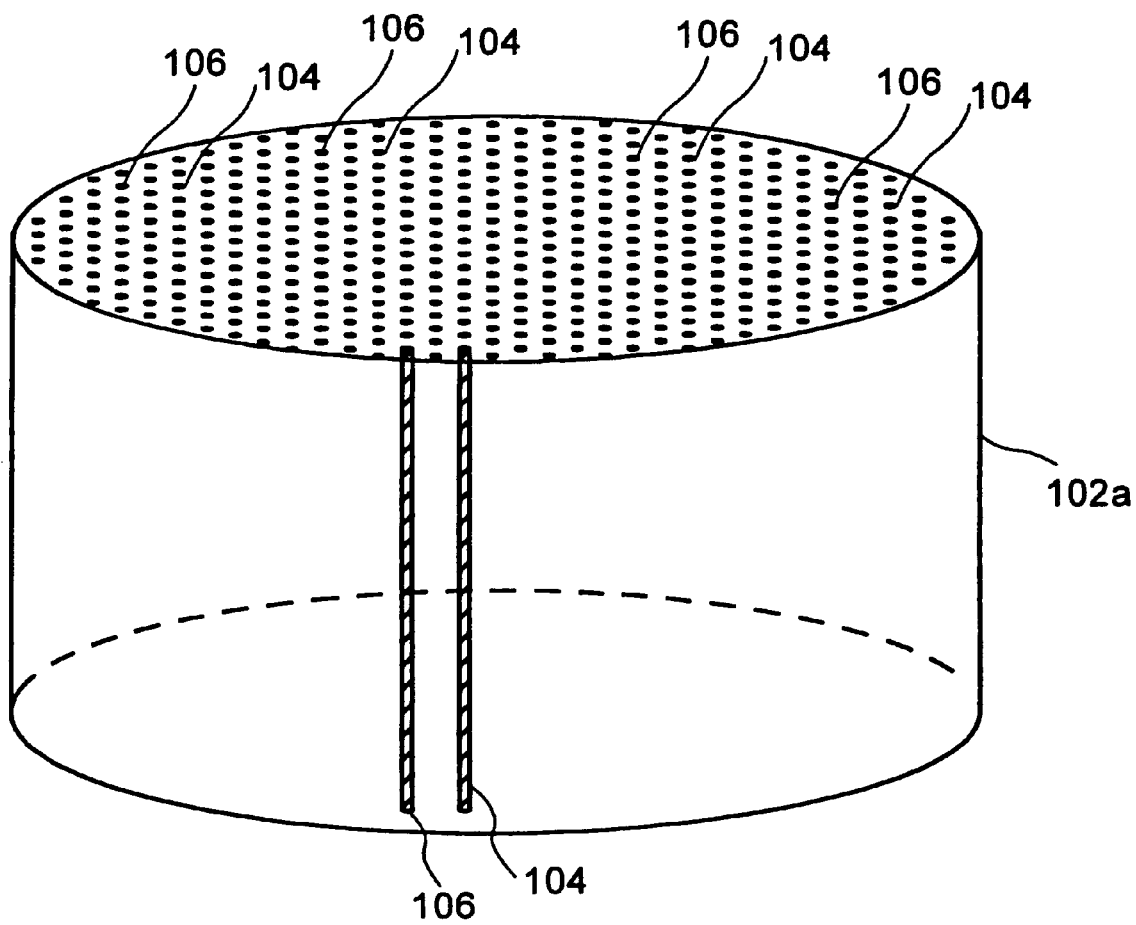
FIG. 4 shows a magnified cross-sectional view of a proximity head in accordance with one embodiment of the present invention.

FIG. 4 shows a magnified cross-sectional view of a proximity head 102a in accordance with one embodiment of the present invention. In this embodiment, a plurality of source inlets 106 and a plurality of source outlets 104 are interspersed throughout the proximity head 102a. Each of the plurality of source inlets 106 and each of the plurality of source outlets 104 are long but thin capillary tubes. The tubes including the plurality of source outlets 104 are small in diameter and allow capillary action (such as, for example, capillary attraction) to take place when located in a position close to the surface of the wafer 108. There, fluid on the surface of the wafer 108 is attracted to the inside surface of the each of the plurality of source outlets 104. Consequently, the fluid moves into the plurality of source outlets 104 by capillary action. With the addition of clean gas pressure or liquid pressure induced by the plurality of source inlets 106 and suction pressure through the plurality of source outlets 104, fluid on the surface of the wafer is easily and efficiently evacuated while extensively reducing droplet formation on the wafer surface. In one embodiment, there are about 2 million capillary tubes dispersed throughout the proximity head 102a that is configured to process 300 mm wafers. It should be understood that any number of capillary tubes may be used in the proximity head 102a as long as liquid can be evacuated off of the surface of the wafer 108 while reducing droplet formation.

Figure 5:
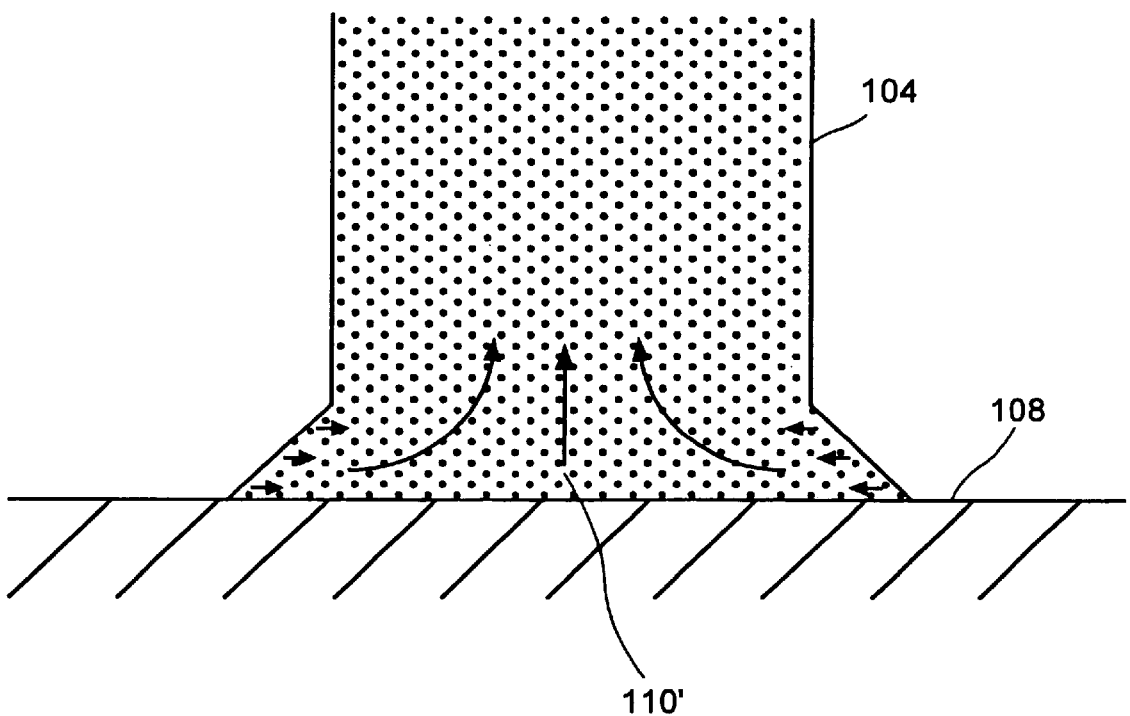
FIG. 5 illustrates capillary action drawing fluid from a surface of a wafer into one of a plurality of source outlets in accordance with one embodiment of the present invention.

FIG. 5 illustrates capillary action drawing fluid from a surface of a wafer 108 into one of a plurality of source outlets 104 in accordance with one embodiment of the present invention. In this embodiment, fluid on the surface of the wafer 108 is attracted to one of a plurality of source outlets 104 by capillary action. Capillary action takes place when water or water based liquids are attracted to a solid surface such as a wall of a thin tube by hydrogen bonding. When the tube is thin enough, the capillary action will be strong enough to draw fluid up the tube by the continuing attraction of the fluid to the surface of the wall comprising the tube. Additionally, the thinner the tube, the higher the liquid will rise up the tube because the weight of the liquid in a thinner tube is less at a specific height than with a thicker tube. In one embodiment, the capillary tubes comprising a plurality of source inlets 106 and a plurality of source outlets 104 are about 5 microns to about 5000 microns in diameter. In another embodiment, the capillary tubes are about 10 microns to about 1000 microns in diameter. In yet another embodiment, the capillary tubes are about 100 microns in diameter. It should be appreciated that the diameter of the capillary tubes may be any size which allows fluid to be pulled up due to capillary action. In an additional embodiment, each of the plurality of source inlets 106 and each of the plurality of source outlets 104 may be arranged in a proximity head 102a where each of the plurality of source inlets 106 and each of the plurality of source outlets 104 alternate. For example, one of the plurality of source inlets 106 may be next to one of a plurality of source outlets 104 which in turn is next to one of the plurality of source inlets 106 and so on. In this way, pressure exerted by the plurality of source inlets 106 and the plurality of source outlets 104 on a fluid film 110 will be nearly consistent throughout the proximity head 102*a*.

Figure 6:
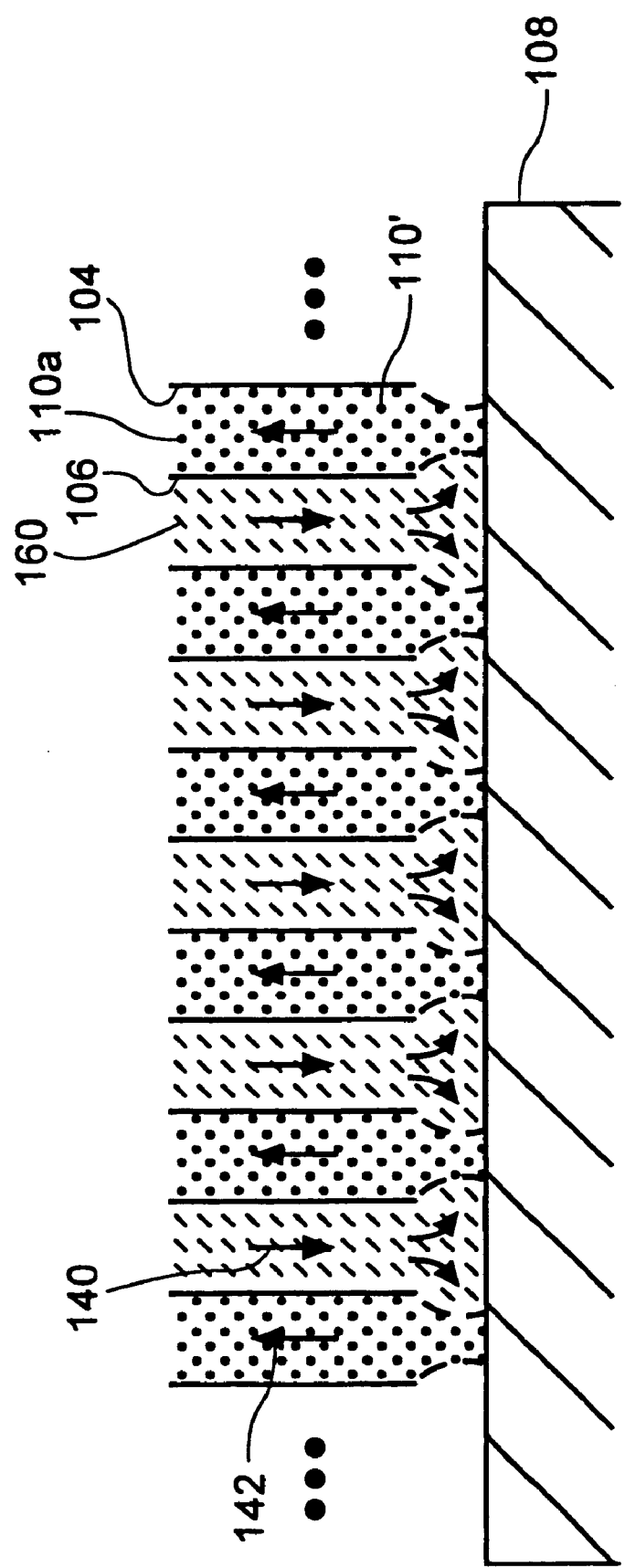
FIG. 6 shows a magnified view of a plurality of source inlets and a plurality of source outlets within a proximity head in accordance with one embodiment of the present invention.

FIG. 6 shows a magnified view of a plurality of source inlets 106 and a plurality of source outlets 104 within a proximity head 102*a* in accordance with one embodiment of the present invention. In one embodiment, a surface of a wafer 108 is covered with a fluid and the proximity head 102*a* dries the wafer 108. It should be appreciated that the proximity head 102*a* may either clean or dry the wafer 108 depending on whether gas (used in drying) or liquid (used in cleaning) is introduced to the wafer surface. In this embodiment, an input source 160 introduces a gas or a liquid on the surface of the wafer 108 which is covered with fluid. The introduction of the gas or the liquid results in an input flow 140 within and immediately below each of the plurality of source inlets 106. At the same time, a plurality of source outlets 104 begins to remove recovered fluid 110*a* from the surface of the wafer 108 through capillary action and suction. The pressure generated by each of the plurality of outlet sources 104 through capillary action and suction creates an output flow 142.

In one embodiment, if a gas is introduced onto the wafer surface by the plurality of source inlets 106, the recovered fluid 110*a* is the fluid that was on the wafer surface before initiation of drying. In another embodiment, if a liquid is inputted to the wafer surface, the recovered fluid 110*a* is a combination of the fluid on the wafer surface and the inputted liquid.

The combination of the input flow 140 and the output flow 142 forms a fluid pocket 110' just below each of the plurality of the source outlets 104. In one embodiment, the wafer 108 may be dried in an even and quick manner where nitrogen gas is introduced by the plurality of source outlets 104. It should be appreciated that other types of gases and mixtures of gases may be used to dry the wafer 108 such as, for example, oxygen gas, carbon dioxide gas, purified air gas, isopropyl alcohol vapor gas, etc. The nitrogen gas from the plurality of source inlets 106 creates pressure on the fluid at the surface of the wafer 108. This pressure pushes against the fluid and forms a fluid pocket 110'. The border of the nitrogen gas and the fluid pocket 110' is a liquid/gas interface. Because the cleaning fluid from the surface of the wafer 108 is removed so quickly due to the dual pressures from the plurality of source inlets 106 and the plurality of source outlets 104, and the short distance between each of the plurality of source inlets 106 and each of the plurality of source outlets 104, the fluid forming the liquid/gas interface is removed before the interface has a chance to break down.

In another embodiment, the wafer 108 may be cleaned where a cleaning fluid such as, for example, DI water may be introduced by the plurality of source inlets 106. It should be appreciated that the cleaning fluid may be any type of cleaning fluid such as an HF based cleaning solution, an SC1 solution ($H_2O$, $NH_4OH$, $H_2O_2$), etc. In this way, the cleaning fluid is circulated such that the fluid flows over the surface of the wafer 108. During this circulation process, the cleaning fluid carries away contaminants from the wafer surface through the plurality of source outlets 104. As can be seen, the proximity head 102*a* has a dual ability to both clean and dry the wafer 108 effectively. In either a cleaning or a drying process, the proximity head 102*a* allows fluid from the wafer 108 to be removed quickly while dramatically reducing the formation of liquid droplets and therefore significantly decreasing the level of contaminants left on the wafer 108.

Figure 7:
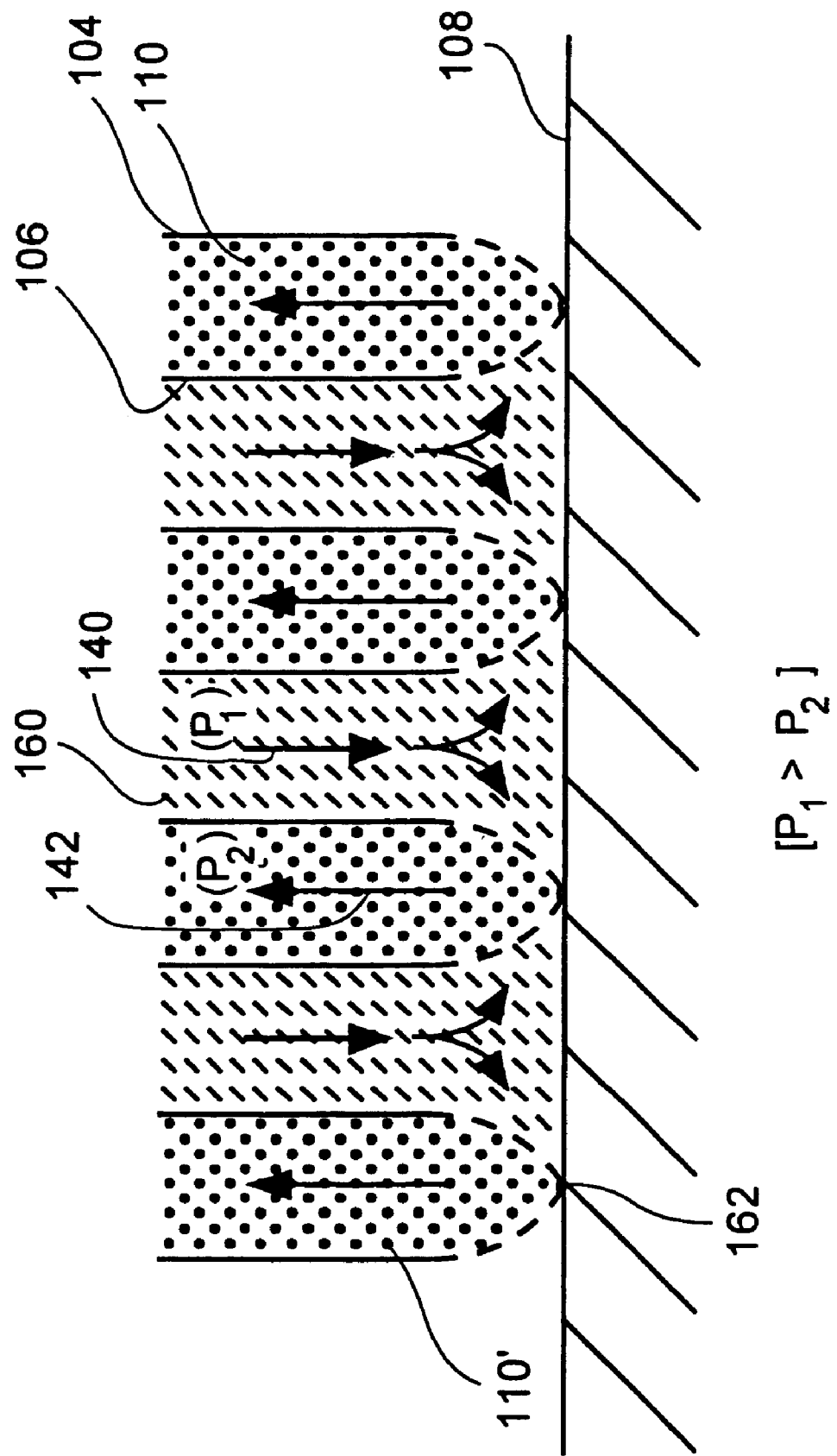
FIG. 7 shows a magnified view of a proximity head during a wafer drying process in accordance with one embodiment of the present invention.

FIG. 7 shows a magnified view of a proximity head 102*a* during a wafer 108 drying process in accordance with one embodiment of the present invention. In this embodiment, a gas is introduced to the surface of the wafer 108 through the plurality of source inlets 106 thereby producing a first pressure resulting in input flow 140. At the same time, capillary action and suction pressure within the plurality of source outlets 106 generate a second pressure which results in output flow 142. It should be understood that the wafer 108 may also be cleaned by the introduction of a cleaning fluid by the plurality of source inlets 104. In one embodiment, the wafer 108 is hydrophobic, but it should be understood that the present invention may clean or dry any other type of wafer such as, for example, hydrophilic wafers or wafers that have both hydrophilic and hydrophobic surfaces. The combination of the first pressure ($P_1$) and the second pressure ($P_2$) (where preferably $P_1 > P_2$) results in removal of water or cleaning fluid from the surface of the wafer. It should be recognized that the first pressure and the second pressure may be any magnitude as long as the pressure combination induces the fluid from the surface of the wafer 108 to be excavated in a quick, robust and powerful manner.

As indicated above, the first pressure is applied toward the wafer 108 through the introduction of the gas while the second pressure is applied away from the wafer 108 through capillary action and suction. This occurs in a fast and well controlled way whereby, as explained in reference to FIG. 6, the fluid pockets 110' form underneath the plurality of source outlets 104. The continuing application of the input flow 140 and the output flow 142 causes the fluid pockets 110' to retract from the surface of the wafer 108 until final contact points 162 form underneath each of the plurality of source outlets 104. This liquid/gas interface stays intact throughout the short fluid removal process because of the surface tension within the fluid. The surface tension allows the liquid portion of the liquid/gas interface to form a strong, internally cohesive border with the gas portion of the interface.

The final contact points 162 are the points where evaporation may take place because of almost insignificant droplets that form on the wafer 108. Because any droplets made at the final contact points 162 are so small, the evaporation of such droplets may leave minimal traceable or performance impacting contaminants on the wafer 108. When drying hydrophobic wafer surfaces, the final contact points 162 left on the wafer 108 by the present invention is especially small. This occurs because the fluid on the surface is repelled by the hydrophobic wafer surface so the fluid will have the least amount of surface area in contact with the wafer 108.

Consequently, the fluid will form almost a ball on the wafer surface. This is one of the reasons the fluid pockets 110' form liquid/gas interfaces that converge on one of the final contact points 162. Therefore, the same reason that makes drying hydrophobic wafers difficult for prior art drying techniques is also the same reason that makes drying hydrophobic wafers relatively easy in the present invention. In one embodiment, the diameter of each of the plurality of source outlets 104 and each of the plurality of source inlets 106 are about 100 microns while each of the final contact points 162 resulting from a drying process are about less than about 1 micron in diameter. Therefore, because of the formation of much smaller fluid droplets on the surface of the wafer 108, the present invention leaves significantly smaller amounts or no contaminants on the wafer 108 in comparison with other drying techniques.

Figure 8:
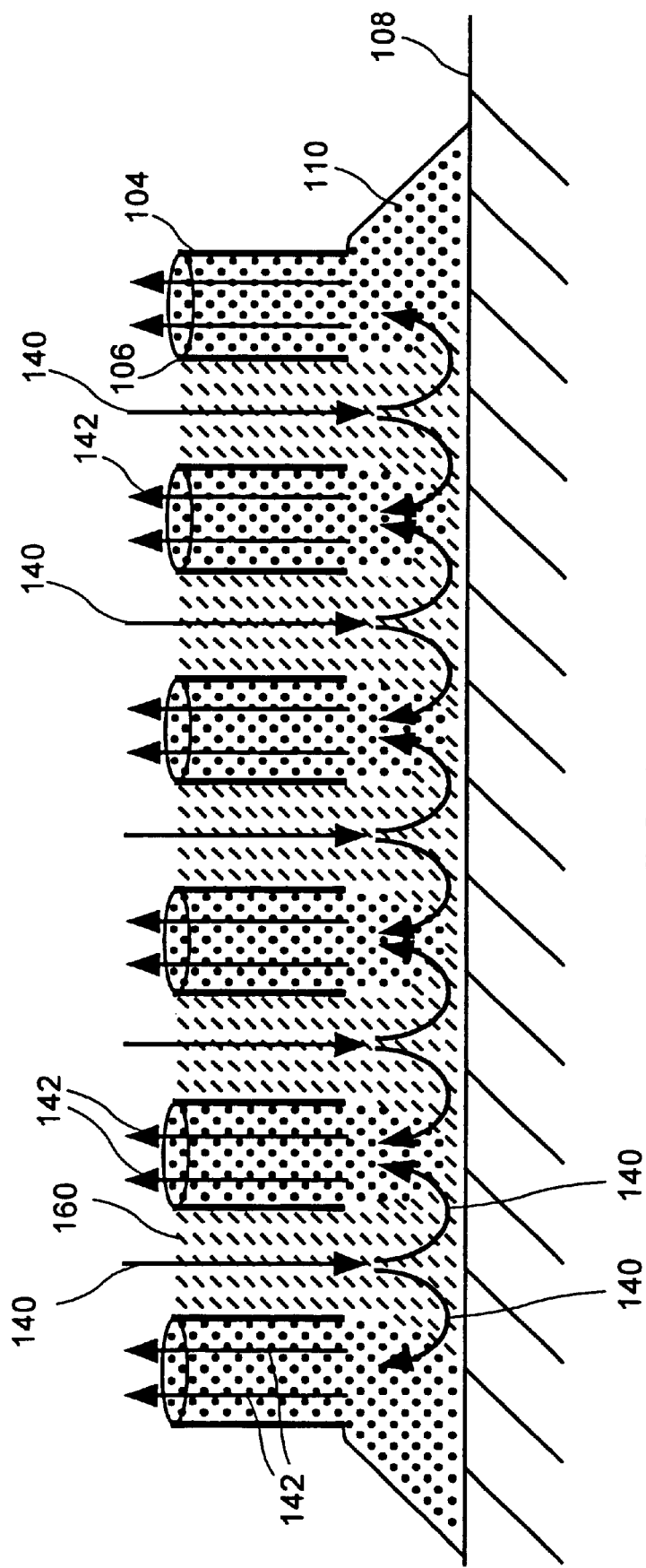
FIG. 8 shows a magnified view of a plurality of source inlets and a plurality of source outlets during a wafer cleaning or drying operation in accordance with one embodiment of the present invention.

FIG. 8 shows a magnified view of a plurality of source inlets 106 and a plurality of source outlets 104 during a wafer cleaning or drying operation in accordance with one embodiment of the present invention. In this embodiment, each of the plurality of source inlets 106 introduces an input source 160 onto a fluid film 110 on the surface of the wafer 108. The input source 160 may be one of a liquid or a gas depending on whether the wafer 108 is being dried or cleaned. In one embodiment of a cleaning process, a cleaning solution is inputted through each of the plurality of source inlets 106 to a fluid film 110 on a wafer 108. The inputting produces an input flow 140 of the cleaning fluid down each of the plurality of source inlets 106 towards the surface of the wafer 108. When the input flow 140 reaches the fluid film 110, the pressure and the semi-circular flow created by the input flow 140 pushes the fluid film away from the source inlet 106 and into the source outlet 104.

At the same time, capillary action and suction from each of the plurality of source outlets 104 generate an output flow 142 away from the surface of the wafer 108. The output flow 142 pulls the fluid film 110 off of the surface of the wafer 108 into the plurality of source outlets 104. It should be realized that a similar mechanism occurs when gas is inputted through the plurality of source inlets 106 such as during a drying process. As described previously, the capillary action is generated by surface attraction the fluid film 110 has for the surface of each of the plurality of source outlets 104. The fluid film 110 is prevented from entering each of the plurality of source inlets 106 because of the pressurized liquid or gas being introduced by the input flow 140.

As described above, the capillary action is created because each of the plurality of source outlets are extremely small in diameter thus increasing the amount of liquid surface attraction. In addition, in one embodiment, each of the plurality of source inlets 106 and each of the plurality of source outlets 104 are arranged in an alternate manner in close proximity to each other. In one embodiment, each of the plurality of source inlets 106 may be addressed separately and chemicals or fluids may be pulsed at, for example, millions of cycles per second. It should be understood that gas or fluids may be inputted in any variety of manner as long as the first pressure toward the wafer 108 from the plurality of source inlets 106 is greater than the second pressure away from the wafer 108 in the plurality of source outlets 104.

In one embodiment, the cleaning and drying apparatuses discusses above may be used in a cluster configuration using a rotary dial plate to move wafers between different processing stations. In this embodiment, each of the stations has its own set of manifolds 116 and proximity heads 102 where the proximity heads 102 are stationary and the dial plate rotates to introduce each wafer 108 to a new processing station. This allows more efficient and quicker wafer processing. It should be recognized that this present invention may be used in a variety of different apparatuses to process semiconductor wafers such as, for example, those utilizing linear configurations, mechanical scrubbing, etc.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for cleaning and drying a semiconductor wafer comprising:

providing a proximity head which includes a plurality of source inlets and a plurality of source outlets;

providing the proximity head close to a wafer surface;

generating a first pressure on a fluid film present on the wafer surface when the proximity head is in a first position that is close to the wafer surface;

introducing a second pressure on the fluid film present on the wafer surface when the proximity head is in the first position; and producing a pressure difference wherein the first pressure is greater than the second pressure, the pressure difference being configured to cause the removal of the fluid film from the wafer surface.

2. A method for cleaning and drying a semiconductor wafer as recited in claim 1, wherein the first pressure is directed toward the wafer surface and the second pressure is sucking.

3. A method for cleaning and drying a semiconductor wafer as recited in claim 1, wherein the providing the proximity head includes dispersing the plurality of source inlets and the plurality of source outlets throughout the proximity head, the proximity head being configured to at least cover a surface area of the wafer surface.

4. A method for cleaning and drying a semiconductor wafer as recited in claim 3, wherein the dispersing the plurality of source inlets and the plurality of source outlets throughout the proximity head includes locating the plurality of source outlets and the plurality of source inlets in an alternating arrangement.

5. A method for cleaning and drying a semiconductor wafer as recited in claim 1, wherein generating the pressure difference includes partially absorbing the fluid film into the plurality of source outlets and away from the wafer surface by capillary attraction.

6. A method for cleaning and drying a semiconductor wafer as recited in claim 1, wherein the generating the first pressure includes introducing a fluid source into the plurality of source inlets thereby assisting in a completion of the one of the cleaning and drying operations.

7. A method for cleaning and drying a semiconductor wafer as recited in claim 1, wherein the generating the first pressure includes introducing clean gas pressure into the plurality of source inlets.

8. A method for cleaning and drying a semiconductor wafer as recited in claim 1, wherein the providing the proximity head includes locating each of the plurality of inlets and each of the plurality of source outlets in close proximity to each other.

9. A method for cleaning and drying a semiconductor wafer as recited in claim 1, wherein moving the proximity head includes locating the proximity head to about in a wafer plane.

10. A method for cleaning and drying a semiconductor wafer as recited in claim 7, wherein a gas used to generate the clean gas pressure is one or a combination of a nitrogen gas, oxygen, carbon dioxide, purified air, and an isopropyl alcohol vapor gas.

11. A method for cleaning and drying a semiconductor wafer as recited in claim 1, wherein each of the plurality of source inlets and each of the plurality of the source outlets each have a diameter of about 5 microns to about 5000 microns.

12. A method for preparing a semiconductor wafer surface, comprising:

providing a plurality of source inlets and a plurality of source outlets;

applying isopropyl alcohol (IPA) vapor gas through the plurality of source inlets to the wafer surface when the plurality of source inlets and outlets are in close proximity to the wafer surface;

applying a fluid through the plurality of source inlets to the wafer surface while applying the IPA vapor gas; and removing the applied IPA vapor gas and fluid from the wafer surface through the plurality of source outlets.

13. A method for preparing a semiconductor wafer surface as recited in claim 12, wherein removing the applied IPA vapor gas and fluid from the wafer surface includes applying suction.

14. A method for preparing a semiconductor wafer surface as recited in claim 13, wherein the suction is applied by the plurality of source outlets.

15. A method for preparing a semiconductor wafer surface as recited in claim 13, wherein the suction is generated by a manifold.

16. A method for preparing a semiconductor wafer surface as recited in claim 12, wherein the IPA vapor gas is pressurized.

* * * * *